United States Patent
Kwan et al.

(10) Patent No.: US 11,968,795 B2
(45) Date of Patent: *Apr. 23, 2024

(54) STRUCTURAL MIDFRAME FOR AN ELECTRONIC DEVICE HAVING A CAMERA AND A SPEAKER

(71) Applicant: Google LLC, Mountain View, CA (US)

(72) Inventors: Laurie Man Sum Kwan, San Francisco, CA (US); Cindy Ngoc-Tran Au, Milpitas, CA (US); Timothy Michael Vanderet, Berkeley, CA (US); Cheng-jung Lee, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/299,597

(22) Filed: Apr. 12, 2023

(65) Prior Publication Data

US 2023/0262918 A1    Aug. 17, 2023

Related U.S. Application Data

(63) Continuation of application No. 17/026,883, filed on Sep. 21, 2020, now Pat. No. 11,659,677.

(51) Int. Cl.
*H05K 7/14* (2006.01)
*F16M 11/04* (2006.01)
(Continued)

(52) U.S. Cl.
CPC ......... *H05K 7/1417* (2013.01); *F16M 11/041* (2013.01); *F16M 11/14* (2013.01);
(Continued)

(58) Field of Classification Search
CPC ........ H04N 23/50; H04N 23/51; H04N 23/52; H04N 23/54; H04N 23/55;
(Continued)

(56) References Cited

U.S. PATENT DOCUMENTS

| 11,659,677 B2 | 5/2023 | Kwan et al. |
| 2016/0205465 A1 | 7/2016 | Slotte et al. |

(Continued)

FOREIGN PATENT DOCUMENTS

| CN | 101594462 | 12/2009 |
| CN | 102620123 | 8/2012 |

(Continued)

OTHER PUBLICATIONS

"Extended European Search Report", EP Application No. 21192698.5, dated Mar. 4, 2022, 8 pages.

(Continued)

*Primary Examiner* — Twyler L Haskins
*Assistant Examiner* — Akshay Trehan
(74) *Attorney, Agent, or Firm* — Colby Nipper PLLC

(57) ABSTRACT

The present document describes an electronic device with a structural midframe and associated methods. The architectural design of the electronic device (e.g., a security camera) is such that its components are assembled onto the midframe to form a subassembly and the housing is assembled after the subassembly. The midframe includes various features that enable multiple printed circuit boards, a camera subassembly, a front housing member, a heatsink, and a heat spreader to be assembled onto the midframe outside of the housing. The midframe can also include a hinge-bearing surface forming a portion of a ball joint for supporting rotational movement of the electronic device. Accordingly, the electronic device uses the midframe, rather than the housing, as a structural member.

24 Claims, 11 Drawing Sheets

(51) Int. Cl.
| | |
|---|---|
| *F16M 11/14* | (2006.01) |
| *F16M 13/02* | (2006.01) |
| *G03B 17/56* | (2021.01) |
| *G08B 13/196* | (2006.01) |
| *H01Q 1/24* | (2006.01) |
| *H01Q 9/04* | (2006.01) |
| *H04N 23/51* | (2023.01) |
| *H04N 23/52* | (2023.01) |
| *H04N 23/54* | (2023.01) |
| *H04N 23/57* | (2023.01) |
| *H05K 7/20* | (2006.01) |

(52) U.S. Cl.
CPC .......... *F16M 13/02* (2013.01); *F16M 13/022* (2013.01); *F16M 13/027* (2013.01); *G03B 17/561* (2013.01); *G08B 13/19617* (2013.01); *H01Q 1/24* (2013.01); *H01Q 9/0407* (2013.01); *H04N 23/51* (2023.01); *H04N 23/52* (2023.01); *H04N 23/54* (2023.01); *H04N 23/57* (2023.01); *H05K 7/2039* (2013.01); *G08B 13/19654* (2013.01)

(58) Field of Classification Search
CPC .. H04N 5723/695; G03B 17/02; G03B 17/08; G03B 17/55; G03B 17/561; G08B 13/19617; G08B 13/19619; G08B 13/1963; G08B 13/19632; H05K 7/1417; H05K 7/2039; F16M 11/041; F16M 11/14; F16M 13/02; F16M 13/022; F16M 13/027

See application file for complete search history.

(56) References Cited

U.S. PATENT DOCUMENTS

| | | | | |
|---|---|---|---|---|
| 2018/0259832 | A1* | 9/2018 | Chen | G03B 17/561 |
| 2018/0343402 | A1* | 11/2018 | Roth | H04N 23/55 |
| 2019/0004401 | A1* | 1/2019 | Wilson | F16M 13/02 |
| 2022/0095472 | A1 | 3/2022 | Kwan et al. | |
| 2023/0363101 | A1 | 11/2023 | Au | |

FOREIGN PATENT DOCUMENTS

| | | |
|---|---|---|
| CN | 204425472 | 6/2015 |
| CN | 206542527 U | 10/2017 |
| CN | 206743456 U | 12/2017 |
| CN | 210469525 | 5/2020 |
| CN | 213094291 | 4/2021 |
| EP | 3407591 | 11/2018 |
| WO | 1994003377 | 2/1994 |
| WO | 2022060476 | 3/2022 |

OTHER PUBLICATIONS

"Foreign Office Action", TW Application No. 110141072, dated May 10, 2022, 6 pages.
"International Preliminary Report on Patentability", Application No. PCT/US2021/044208, daated Mar. 21, 2023, 8 pages.
"International Search Report and Written Opinion", Application No. PCT/US2021/044208, dated Nov. 15, 2021, 10 pages.
"Non-Final Office Action", U.S. Appl. No. 17/026,883, dated Oct. 17, 2022, 13 pages.
"Notice of Allowance", U.S. Appl. No. 17/026,883, dated Feb. 2, 2023, 12 pages.
"Sonos Bulb UCSB Capstone Project", UC Santa Barbara Engineering, Accessed online at: https://web.ece.ucsb.edu/Faculty/Johnson/ECE189/final/bulb.pdf on Sep. 17, 2020, Jun. 2, 2016, 54 pages.
"Foreign Office Action", EP Application No. 21192698.5, Oct. 16, 2023, 4 pages.
"Foreign Office Action", TW Application No. 112113296, Feb. 22, 2024, 15 pages.

\* cited by examiner

STRUCTURAL MIDFRAME FOR AN ELECTRONIC DEVICE HAVING A CAMERA AND A SPEAKER

CROSS-REFERENCE TO RELATED APPLICATION(S)

This application is a continuation of U.S. Non-Provisional patent application Ser. No. 17/026,883, filed on Sep. 21, 2020, the disclosure of which is incorporated by reference herein in its entirety.

BACKGROUND

As technology evolves, maintaining a low cost of production of an electronic device may be challenging. In some cases, reducing the production cost may include reducing the complexity of a device's components and/or the number of steps used in the assembly process. Some devices with a small form factor have limited available space within a housing for operators and tools to assemble internal components. Consequently, there may be insufficient clearance for the operator or tool to easily access areas within the housing to fasten components together. One solution is to fix multiple internal components to the housing; however, using the housing as a structural member may result in a more-complex housing geometry and, in some cases, a device that is difficult to rework.

SUMMARY

The present document describes an electronic device with a structural midframe and associated methods. The architectural design of the electronic device (e.g., a security camera) is such that its components are assembled onto the midframe to form a midframe subassembly and the midframe subassembly is placed in a portion of the housing. The midframe includes various features that enable multiple printed circuit boards, a camera subassembly, a front housing member, a heatsink, and a heat spreader to be assembled onto the midframe outside of the housing. The midframe can also include a hinge-bearing surface forming a portion of a ball joint for supporting rotational movement of the electronic device. Accordingly, the electronic device uses the midframe, rather than the housing, as a structural member.

In some aspects, an electronic device is disclosed. The electronic device may include a housing member, a midframe, and a plurality of components assembled onto the midframe. The housing member may form a shell with a cap. The midframe may define an aperture and form a structural frame for the electronic device. The midframe may also be positioned within the housing member in an orientation that is substantially coaxial with the housing member. The plurality of components may include a wireless-network antenna assembled onto an outer surface of the midframe, a camera subassembly assembled onto the midframe and positioned coaxially with the midframe, one or more printed circuit boards assembled onto the midframe, and a speaker module assembled onto the midframe.

In other aspects, a structural midframe for an electronic device is disclosed. The structural midframe includes a shape defining an aperture and configured to be slidably inserted into a housing member forming a shell. The structural midframe also includes an inner surface associated with an inner diameter and an outer surface associated with an outer diameter. In addition, the structural midframe includes an antenna region located on the outer surface, where the antenna region includes a substantially planar region and at least two alignment protrusions for aligning a flexible printed circuit board having an antenna that is configured to be assembled onto the structural midframe. The structural midframe further includes a plurality of features for assembling a plurality of printed circuit boards, one or more heat spreaders, and one or more heatsinks onto the structural midframe. Also, the midframe includes a plurality of snap features positioned on the inner surface, where the plurality of snap features are configured to mate with corresponding snap features on a front housing member to enable assembly of the front housing member to the structural midframe. Additionally, the structural midframe includes a hinge-bearing surface, a crossbeam, and first and second ribs. The hinge-bearing surface may have a concave surface forming an inverse of a portion of a sphere and may be configured to interface with a sphere of a ball joint. The crossbeam may be positioned to longitudinally extend transversely across the aperture from a first region of the inner surface to a second region of the inner surface. Further, the crossbeam may be located proximate to the hinge-bearing surface. The first and second ribs may longitudinally extend transversely between the outer surface and the inner surface. Also, the first and second ribs may be positioned on opposing sides of the hinge-bearing surface and configured to interface with mating ribs on a boot of the ball joint.

In other aspects, a method for assembly of a midframe subassembly is disclosed. The method includes mounting a camera subassembly onto a camera board and mounting the camera board onto a midframe that forms a structural frame for the electronic device, where the camera board is mounted to be coaxial with the midframe. In addition, the method includes mounting a heat spreader onto the midframe to cause the camera board to be positioned between the heat spreader and the midframe. The method also includes mounting an antenna onto an outer surface of the midframe. The method further includes electrically connecting the camera board to an infrared board and mounting the infrared board onto the midframe to cause the camera board to be positioned between the infrared board and the heat spreader. Additionally, the method includes electrically connecting the camera board to a main logic board and mounting the main logic board onto the midframe to provide the midframe subassembly.

This summary is provided to introduce simplified concepts of an electronic device with a structural midframe and associated methods, which is further described below in the Detailed Description. This summary is not intended to identify essential features of the claimed subject matter, nor is it intended for use in determining the scope of the claimed subject matter.

BRIEF DESCRIPTION OF THE DRAWINGS

The details of one or more aspects of an electronic device with a structural midframe and associated methods are described in this document with reference to the following drawings. The same numbers are used throughout the drawings to reference like features and components.

DETAILED DESCRIPTION

This document describes an electronic device with a structural midframe and associated methods. The architecture of the electronic device is such that the majority of internal components of the electronic device can be assembled onto the structural midframe to form a midframe subassembly outside of the housing and the housing can be assembled onto the electronic device last. This enables the housing to maintain a simple geometry (with less mounting features), which in turn enables the housing to be a cheaper, more environmentally-friendly, as-molded cosmetic part (without requiring paint to achieve a desired gloss level or cover molding imperfections). Further, using the structural midframe described herein, fewer components may be fixed to the housing, which increases the reworkability of the electronic device. Because the housing (e.g., cosmetic enclosure) is the assembled after the midframe subassembly, additional testing may be performed on the midframe subassembly (e.g., assembled components and modules) prior to assembling the housing. If some failure or fallout occurs during the assembly process, the techniques herein enable an operator to make the appropriate repairs or adjustments, rather than disassemble the electronic device and risk damaging the housing.

While features and concepts of the described electronic device with a structural midframe and associated methods can be implemented in any number of different environments, aspects are described in the context of the following examples.

Example Device

Figure 1:
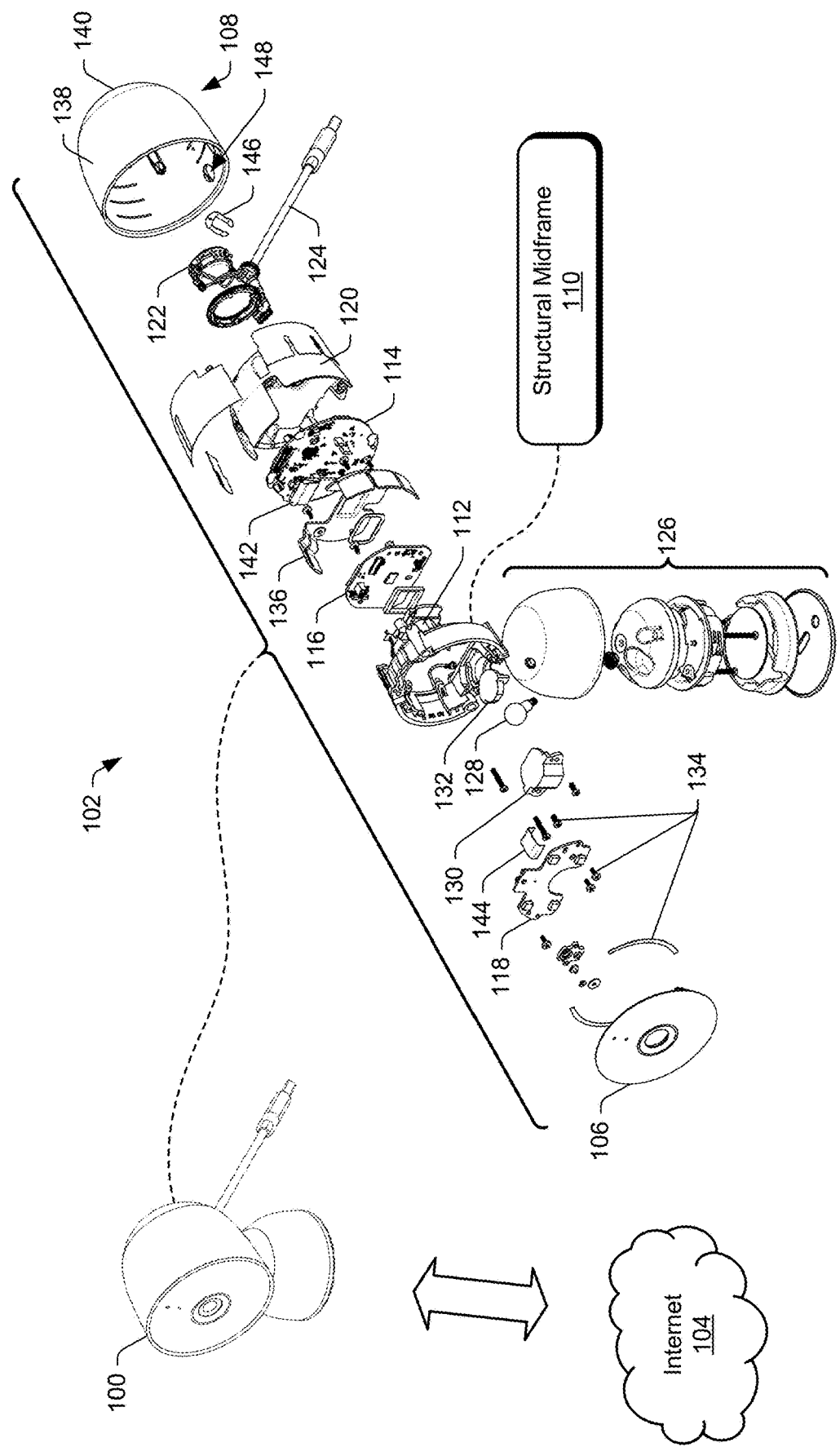
FIG. 1 illustrates an example electronic device and an exploded view of some components thereof.
Figure 2:
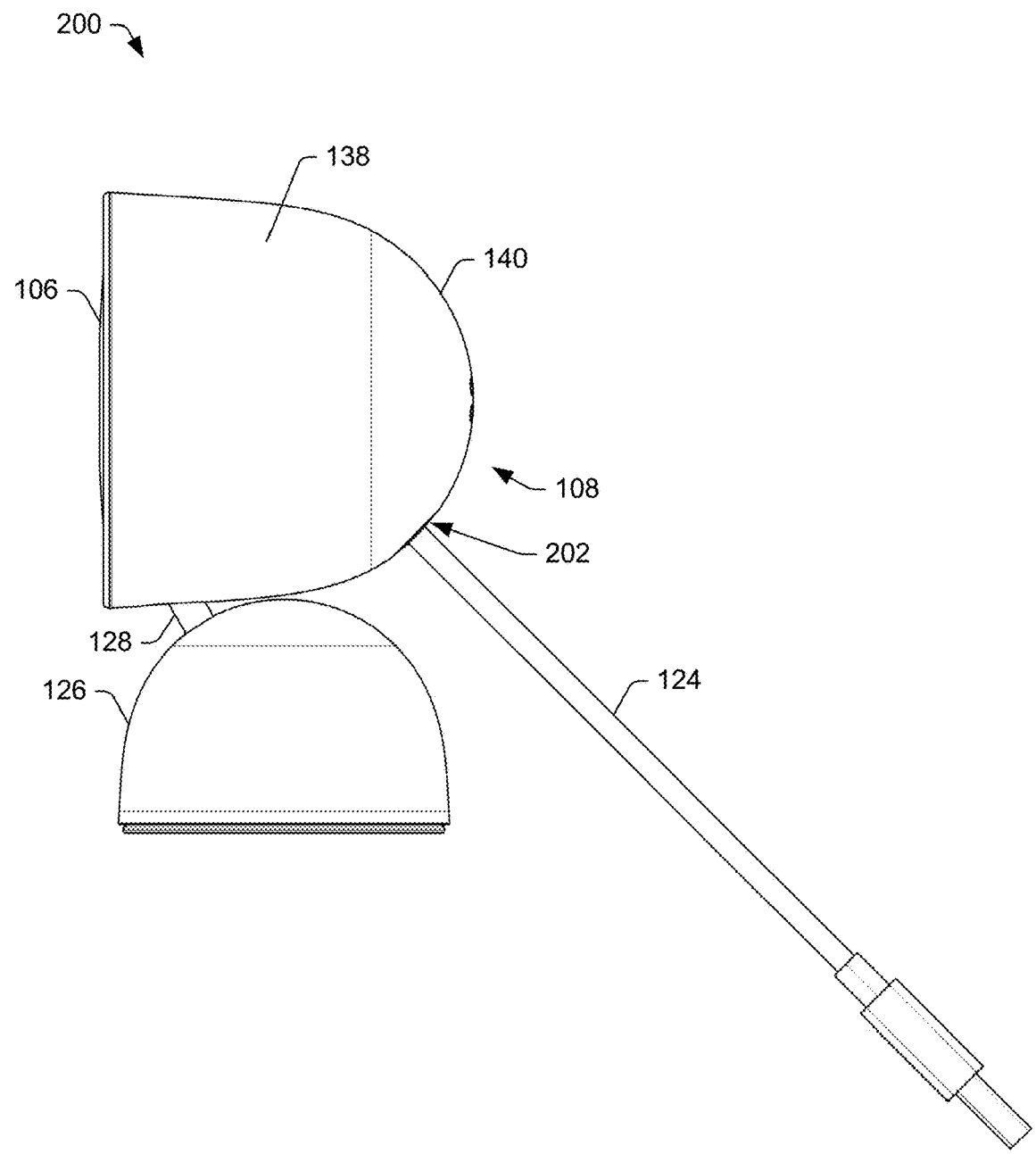
FIG. 2 illustrates an example right elevational view of the electronic device from FIG. 1.
Figure 3:
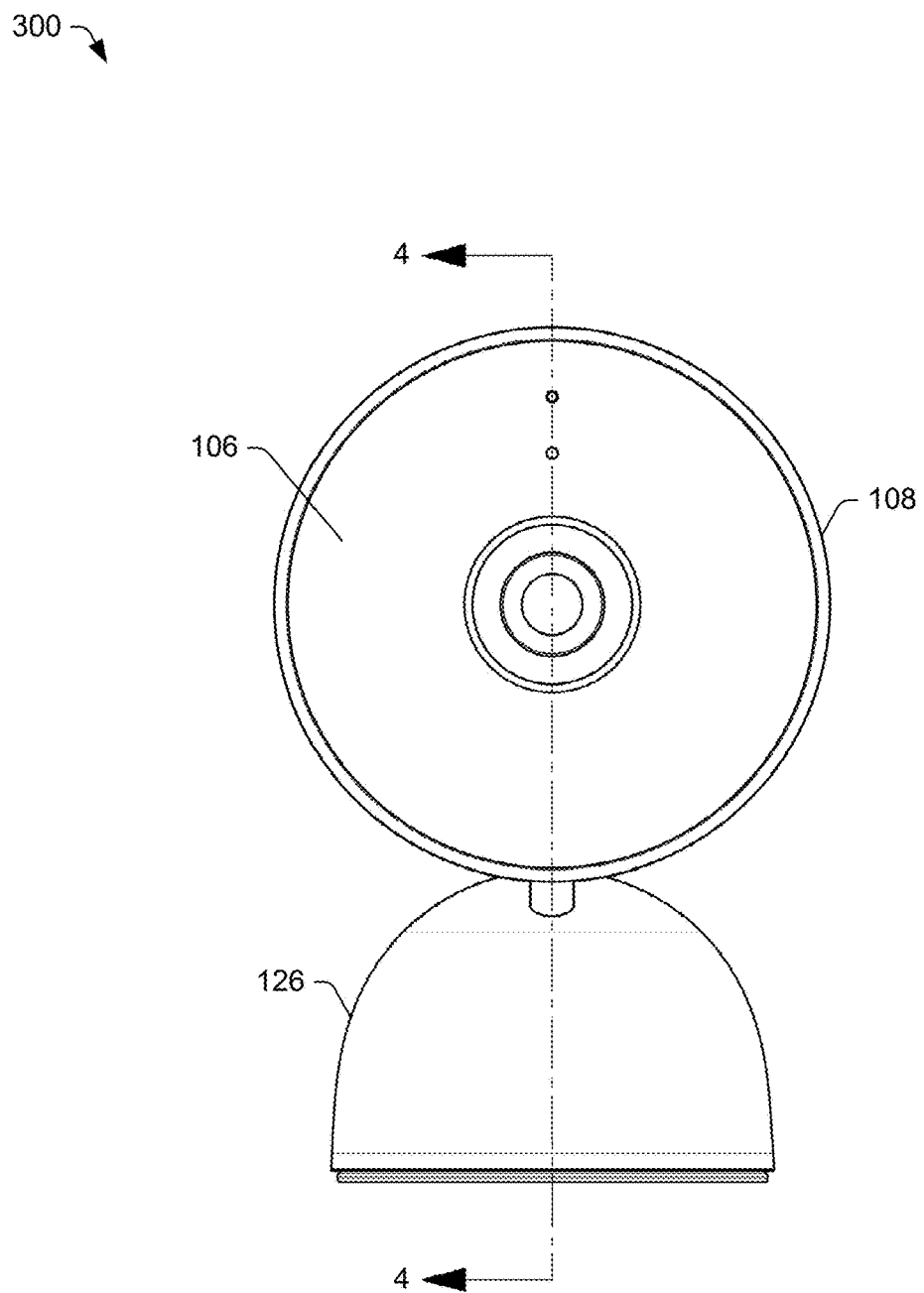
FIG. 3 illustrates a front elevational view of the electronic device from FIG. 1.
Figure 4:
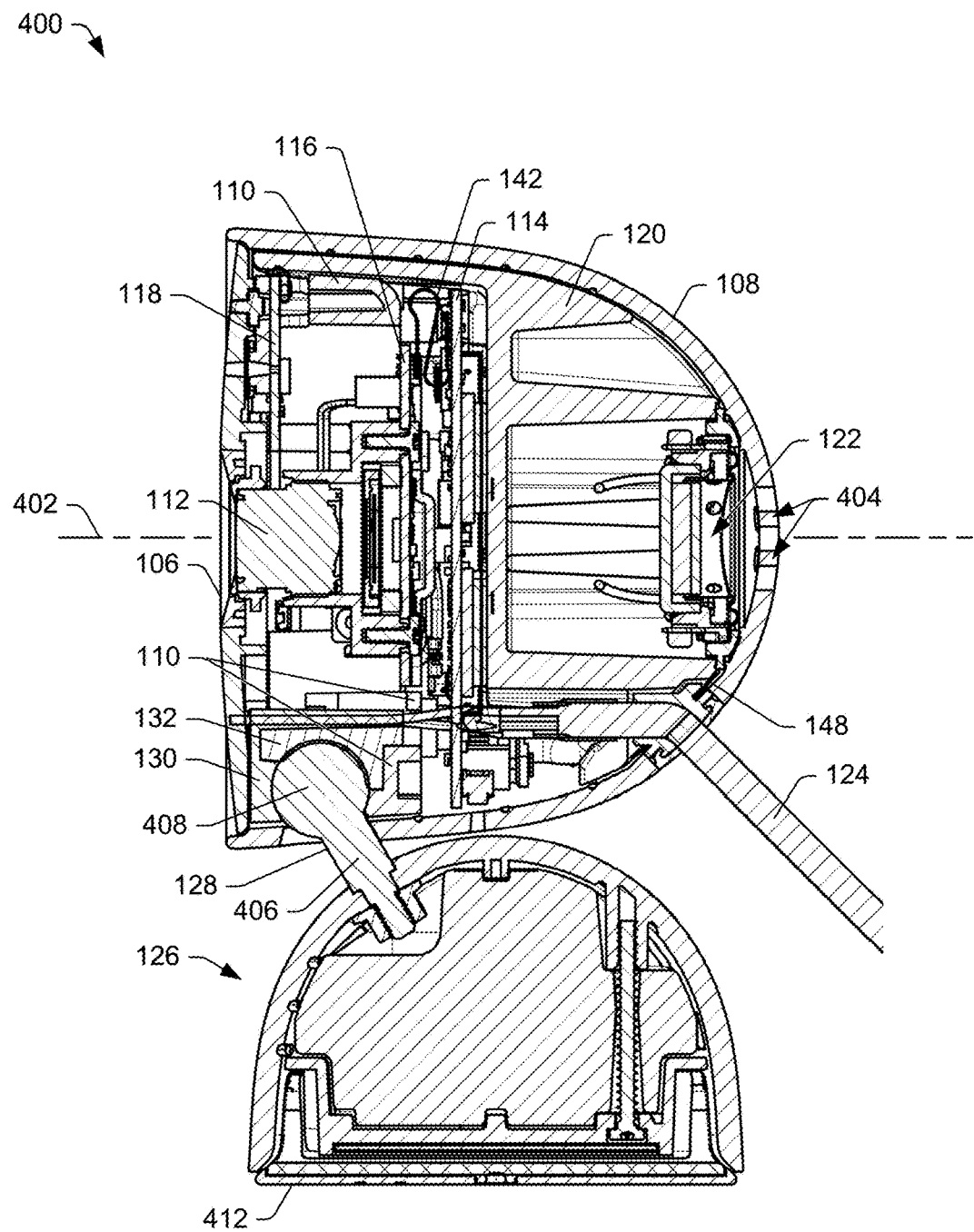
FIG. 4 illustrates a section view of the electronic device from FIG. 3, taken along line 4-4.

FIG. 1 illustrates an example electronic device 100 (e.g., a security camera) and an exploded view 102 of some components thereof. FIG. 2 illustrates an example right elevational view 200 of the electronic device from FIG. 1. FIG. 3 illustrates a front elevational view 300 of the electronic device from FIG. 1. FIG. 4 illustrates a section view 400 of the electronic device from FIG. 3, taken along line 4-4. In the following, reference may be made to various components or parts of the electronic device 100 illustrated in any of FIGS. 1-4.

The electronic device 100, in some aspects, may use a voice-activated virtual assistant. The electronic device 100 may connect to the Internet 104 (e.g., through a wireless router) and support a variety of functions, including capturing audio and/or video data (including images or streaming video), transmitting the captured data to online storage, storing the captured data to local memory, streaming audio (e.g., music, news, podcasts, sports), and interacting with a virtual assistant to perform tasks (e.g., search the internet, schedule events and alarms, control home automation, control internet-of-things (IoT) devices), and so on.

The electronic device 100 includes a housing formed by one or more housing members, including a front housing member 106 (e.g., a front cover) and a rear housing member 108 (e.g., a head housing), a structural midframe 110 (also referred to as the midframe 110), a camera subassembly 112, and multiple printed circuit boards (PCBs) including at least a main logic board (MLB) 114, a camera board 116, and an infrared (IR) board 118. Additional PCBs may also be used. The PCBs may include various integrated circuit (IC) components, including system-on-chip (SoC) IC devices, processors, and IC components for light-emitting diode(s) (LEDs), microphone(s), or sensors for detecting input such as touch-input, a button-press, or a voice command. The electronic device 100 also includes a heatsink 120, a speaker module 122, and a cable 124 (e.g., power cable). The electronic device 100 may also include a stand assembly 126. In some aspects, the electronic device 100 may include a hinge, such as a generally spherical ball joint formed by a stem 128 (e.g., ball stem), a bracket 130 (e.g., ball stem bracket) and a boot 132 (e.g., ball stem boot). The bracket 130 is mounted to the midframe 110 to secure the boot 132 and the stem 128 in place. The electronic device 100 may further include removable assembly components, such as fasteners 134 (e.g., screws, bolts, adhesive, pressure-sensitive adhesive (PSA)). Along with the heatsink 120, the electronic device 100 may include one or more additional thermal-control components (e.g., heat spreader 136, thermal interface materials (TIMs) such as thermal gel, thermal paste, thermal adhesive, thermal tape) with high thermal conductivities.

The housing members 106 and 108 may include a plastic material and be formed, for example, using plastic-injection molding techniques. The housing members 106 and 108 may include any suitable geometry, including the example geometry illustrated in FIG. 1. For instance, the rear housing member 108 may form a shell 138 (e.g., a hollow cylinder or generally cylindrical shell) with a cap 140 (e.g., a generally spherical cap) at one end of the cylinder. An example profile view of the rear housing member 108 is shown in FIG. 2, which illustrates a tapering diameter of the shell 138 that is capped at the back end by the cap 140. This leaves an opposing end of the shell 138 open. In this way, the rear housing member 108 forms a general cup shape with an open end and an opposing, rounded, closed end. Although the examples described herein illustrate a generally cylindrical shell and a generally spherical cap, alternate shapes may also be implemented for the shell and cap. For example, the rear housing member 108 may form an oblong shell or any other suitably-shaped shell, with a cross-section having any suitable shape, including an oval shape, a square shape, a rectangular shape, a triangular shape, or an asymmetrical shape.

The rear housing member 108 defines a cavity for housing various components of the electronic device 100. In the illustrated example, the rear housing member 108 is a single, solid part, which is smooth (seamless), and cosmetically designed, but also enables manufacturing at low cost. Alternatively, the rear housing member 108 may include multiple parts assembled together. The front housing member 106 may form a general disk-shaped object that covers the open end (front) of the shell. The front housing member 106 may assemble to the midframe 110 via any suitable fastener or combination of fasteners, including PSA, one or more clips or snaps, screws, bolts, and so forth. The front housing member 106 may also include an aperture or transparent region that is aligned with the camera subassembly 112 to enable the camera subassembly 112 to view through the aperture or transparent region and capture images or video of a scene.

The structural midframe 110 is configured to be slidably inserted into the rear housing member 108 and form a structural frame for the electronic device 100. In aspects, the structural midframe 110 is formed such that a majority of the internal components of the electronic device 100 are assembled to the midframe 110, rather than to the housing. The internal components of the electronic device 100 can be assembled to the midframe 110 to create a midframe subassembly outside of the housing. This midframe subassembly can be tested prior to enclosing the assembled components within the housing, which allows modifications, adjustments, and repairs to be performed without risking damage to the housing via disassembly. Because the majority of the components of the electronic device 100 are assembled (e.g., mounted) to the midframe 110, the housing can be formed with a geometry that can be molded cosmetically at low cost. The midframe 110 may be formed using any suitable technique, such as injection molding using any suitable material, such as a polycarbonate material (e.g., 75% post-consumer recyclable polycarbonate, 95% post-consumer recyclable polycarbonate) or other thermoplastic polymer. The midframe 110 may also include a region forming a portion of a hinge. For example, and as discussed further herein, the region may include an inverse of a generally spherical ball joint.

Turning to FIG. 4, the camera subassembly 112 may capture images within a field of view of the electronic device 100 and may be mounted to the midframe 110. In some aspects, the camera subassembly 112 may be concentrically mounted to the midframe 110 such that the camera subassembly 112 is positioned within a perimeter of the midframe 110 and is positioned coaxially or shares a center axis (e.g., axis 402) with the midframe 110. Returning to FIG. 1, the camera subassembly 112 may be mounted to a first side of the camera board 116, which is opposite a second side of the camera board 116 to which the main logic board 114 may be electrically connected. In some implementations, the heat spreader 136 may be positioned between the camera board 116 and the main logic board 114. As illustrated in FIG. 4, the camera subassembly 112 is positioned proximate to a front of the electronic device 100 and may abut the front housing member 106, which includes an aperture or transparent portion aligned with the camera subassembly 112 to enable the camera subassembly 112 to capture images and/or video of a scene within its field of view.

The PCBs (e.g., the main logic board 114, the camera board 116, the IR board 118) shown in FIG. 1 may be formed, for example, from glass-reinforced epoxy material such as FR4. In some instances, the PCBs may include a single layer of electrically conductive traces and be a single-layer board. In other instances, the PCBs may be a multi-layer board that includes multiple layers of electrically conductive traces that are separated by layers of a dielectric material. As illustrated in FIG. 4, each of the PCBs may be mounted to the midframe 110, either directly or indirectly (e.g., mounted to another component that is assembled to the midframe). Accordingly, the PCBs are mounted to the midframe 110 and not mounted to the housing. In the example shown in FIG. 1, each of the PCBs is to be mounted directly to the midframe 110.

Returning to FIG. 1, the main logic board 114 may be assembled to the midframe 110 proximate to a rear opening of the midframe 110 that opens toward a rear of the electronic device 100 (e.g., proximate to the cap 140 of the rear housing member 108). In aspects, the main logic board 114 may be positioned between the heatsink 120 and the midframe 110. Also, the main logic board 114 may be positioned between the heatsink 120 and the heat spreader 136. The main logic board 114 may be electrically connected to the camera board 116, e.g., via a flexible printed circuit (FPC) 142 and separated from the camera board 116 by the heat spreader 136.

The camera board 116 may be assembled to the midframe 110 proximate to the rear opening of the midframe 110 and within an interior of the midframe 110. The camera board 116 may be connected to the camera subassembly 112. In addition, the camera board 116 may be electrically connected to the IR board 118, e.g., via a flexible flat cable (FFC) 144. The camera board 116 may be positioned between the camera subassembly 112 and the main logic board 114. Also, the camera board 116 may be positioned between the heat spreader 136 and the midframe 110.

The IR board 118 may be assembled to the midframe 110 and include circuitry to manage various functionality, including motion detection within the field of view of the electronic device 100 and/or facial detection of a face in the field of view. In an example, the IR board 118 may be mounted to the midframe 110 using one or more fasteners, including screws. The IR board 118 may be electrically connected to an IR illuminator and IR sensor, which may be usable for the motion detection or the facial recognition. The IR board 118 may be mounted proximate to a front opening of the midframe 110 that is open toward a front of the electronic device 100 (e.g., proximate to the front housing member 106) such that the camera board 116 is between the IR board 118 and the heat spreader 136.

The heatsink 120 and the heat spreader 136 may be implemented to transfer and spread energy from heat-dissipating components on the PCBs, including SoC IC devices, memory devices, processors, and so forth. The heat spreader 136 may be positioned between the main logic board 114 and the camera board 116 to transfer and spread heat generated by one or more heat-generating IC components (e.g., SoC IC component, memory IC components, audio amplifiers, and audio inductors) on the main logic board 114 and/or on the camera board 116. The heatsink 120 may be positioned on an opposing side of the main logic board 114 from the midframe 110 to transfer and spread heat generated by one or more heat-generating IC components on the main logic board 114 toward a back end and lateral sides of the electronic device 100. The main logic board 116 may include a shielding cover that shields IC components mounted on the main logic board 116. The shielding cover may be mounted on a first side of the main logic board 116 that is opposite a second side that faces the heat spreader 136. Thermal interface material may be dispensed onto the shielding cover to distribute heat generated by the IC components on the main logic board 116 to the heatsink 120.

The speaker module 122 may be assembled to the heatsink 120 and positioned such that the heatsink 120 is between the speaker module 122 and the midframe 110. In this way, the speaker module 122 may output audio waves toward a back side of the electronic device 100 (e.g., toward the cap 140 of the rear housing member 108). Referring to FIG. 4, the cap 140 of the rear housing member 108 may include one or more holes 404 (e.g., perforations) aligned with the speaker module 122 to provide a path for the audio waves to exit the housing. The speaker module 112 may be electrically connected to the main logic board 114 via one or more wires passing through or around the heatsink 120.

Returning to FIG. 1, the cable 124 may be assembled to the main logic board 114. As illustrated in FIG. 2, the cable 124 may be positioned to longitudinally extend through a hole in the rear housing member 108, such as a hole 202 in the cap 140. Returning to FIG. 1, the cable 124 may be assembled with a clip 146, which resists longitudinal movement of the cable 124 through the hole 202 in the rear housing member 108 from within the cavity toward the outside of the rear housing member 108. During assembly, for example, a portion of the cable 124 may be inserted through the hole 202 in the rear housing member 108 from outside of the rear housing member 108 and into the cavity. The cable 124 is overextended through the hole 202 and also through the open end of the rear housing member 108 to enable assembly of the cable 124 to the main logic board 114 outside of the rear housing member 108 (e.g., beyond the open end of the rear housing member 108). Subsequent to assembling the cable 124 to the main logic board 114, which is assembled to the midframe 110, the cable 124 is moved in the opposite direction through the hole 202 to partially exit the cavity. The clip 146 retains a portion of the cable 124 in the cavity by preventing the cable 124 from exiting the rear housing member 108 beyond a location at which the clip 146 engages the cable 124. The rear housing member may include an additional hole (e.g., hole 148), which may allow the stem 128 of the hinge to extend through to the stand assembly 126.

The stand assembly 126 may include a variety of components assembled together to support the electronic device 100. In the example illustrated in FIG. 4, the stand assembly 126 may be connected to the stem 128 of the hinge. The stem 128 includes a shaft portion 406 and a head portion 408 (e.g., sphere). The shaft portion 406 is inserted through a hole 410 in the rear housing member 108 and the head portion 408 is positioned between the midframe 110, the boot 132, the bracket 130, and the rear housing member 108. The stand assembly 126 includes a base 412 that may be mounted to any suitable surface, such as a wall, a table, or a ceiling to support the electronic device 100. Further, the stand assembly 126 may be removably connected to the stem 128 of the hinge.

Example Structural Midframe

Figure 5:
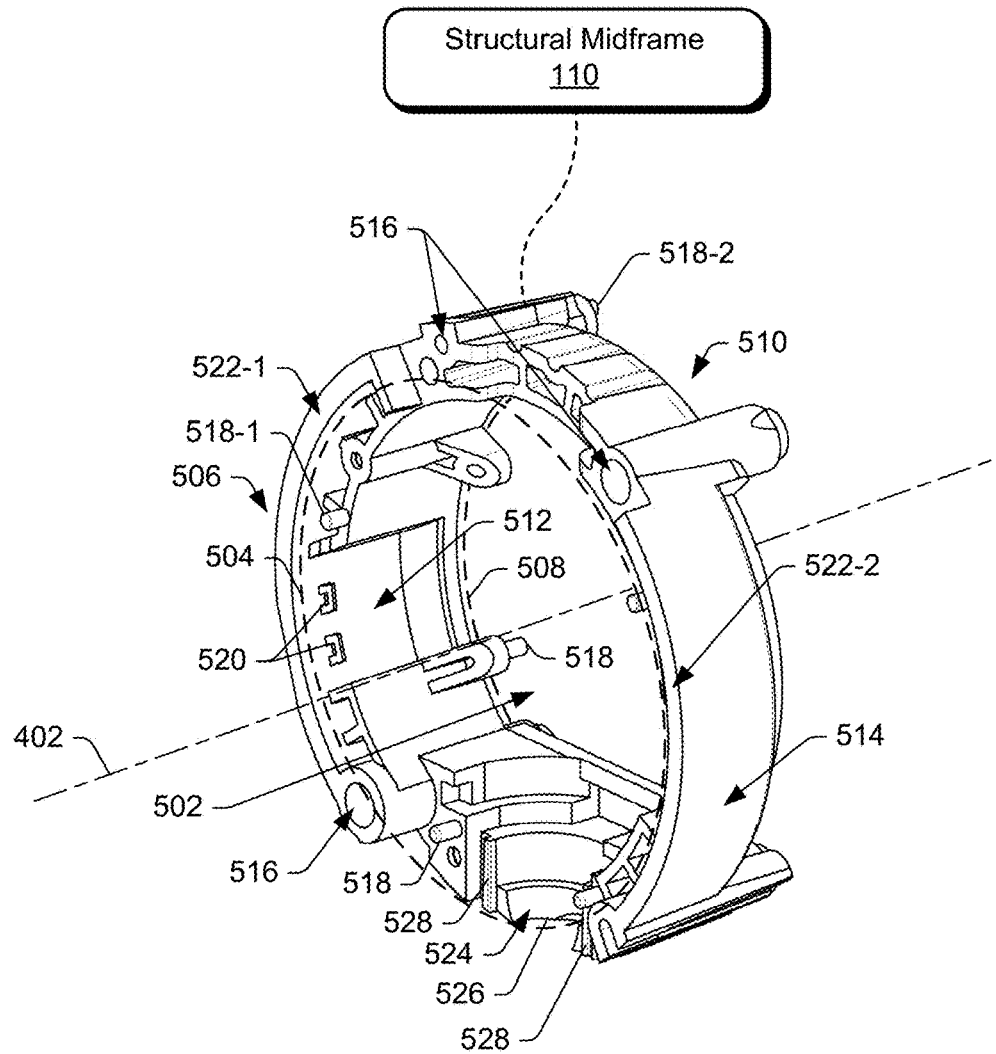
FIG. 5 illustrates a front-right isometric view of the example midframe from FIG. 1.
Figure 6:
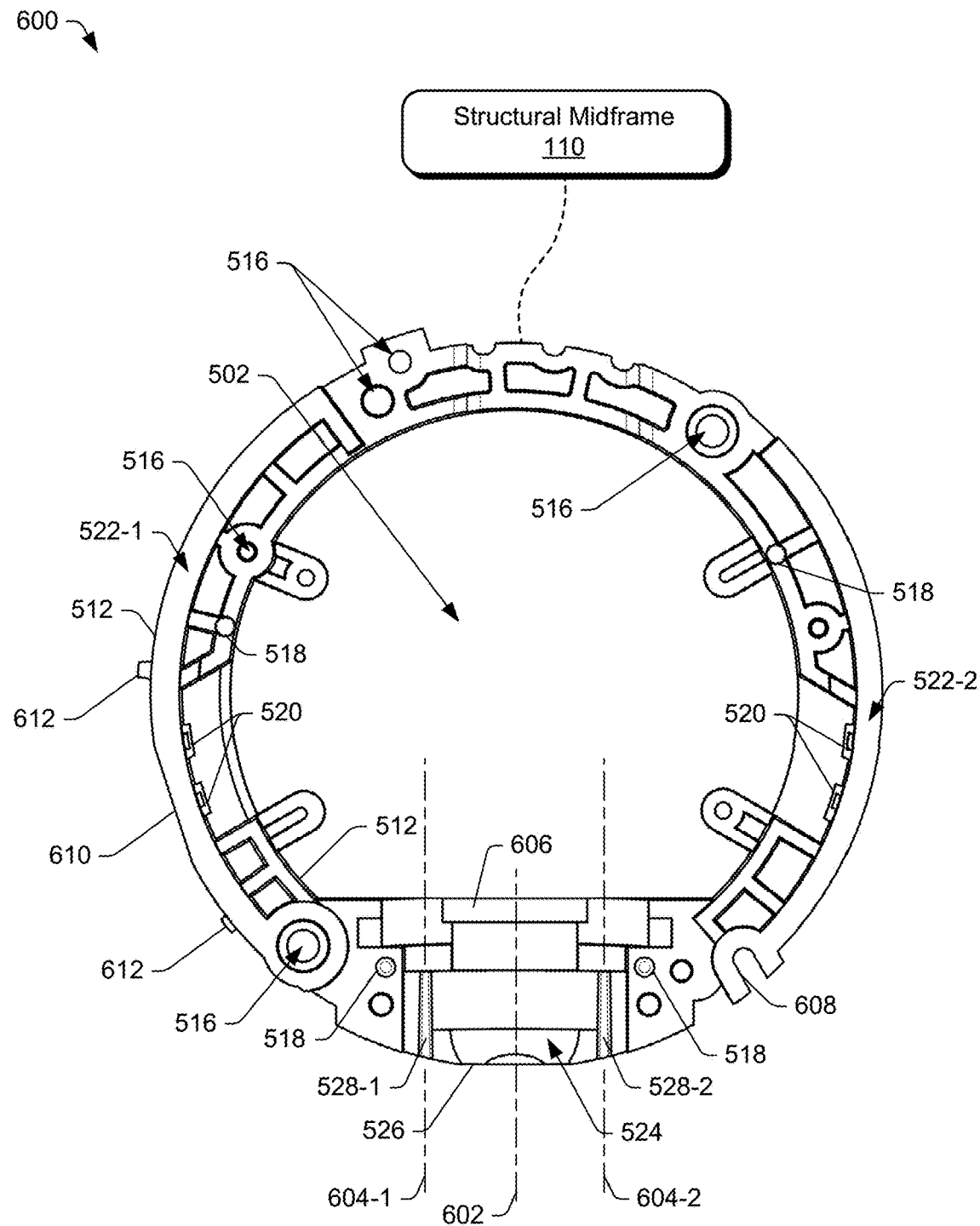
FIG. 6 illustrates a front elevational view of the midframe from FIG. 5.
Figure 7:
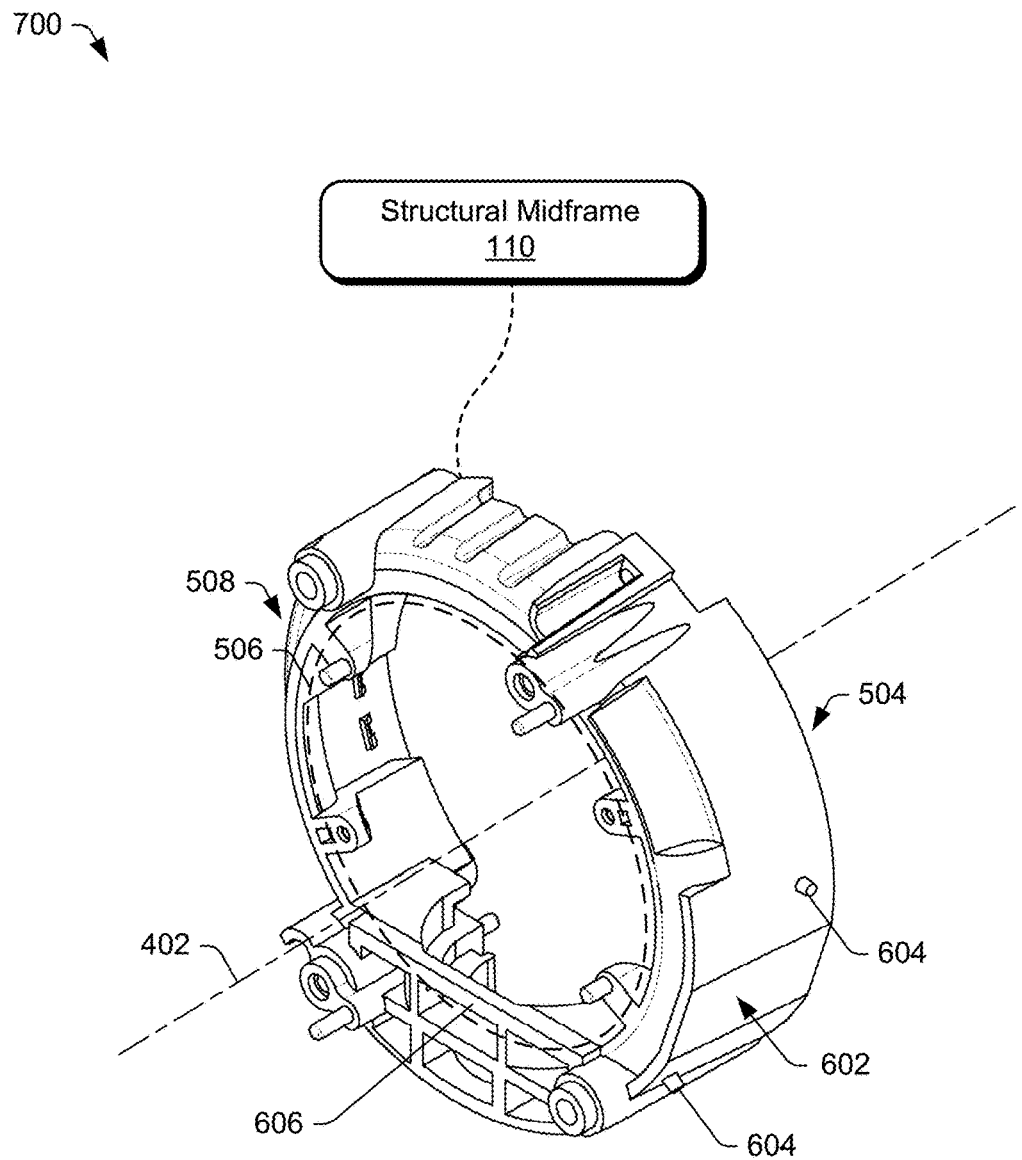
FIG. 7 illustrates a rear-left isometric view of the example midframe from FIG. 1.
Figure 8:
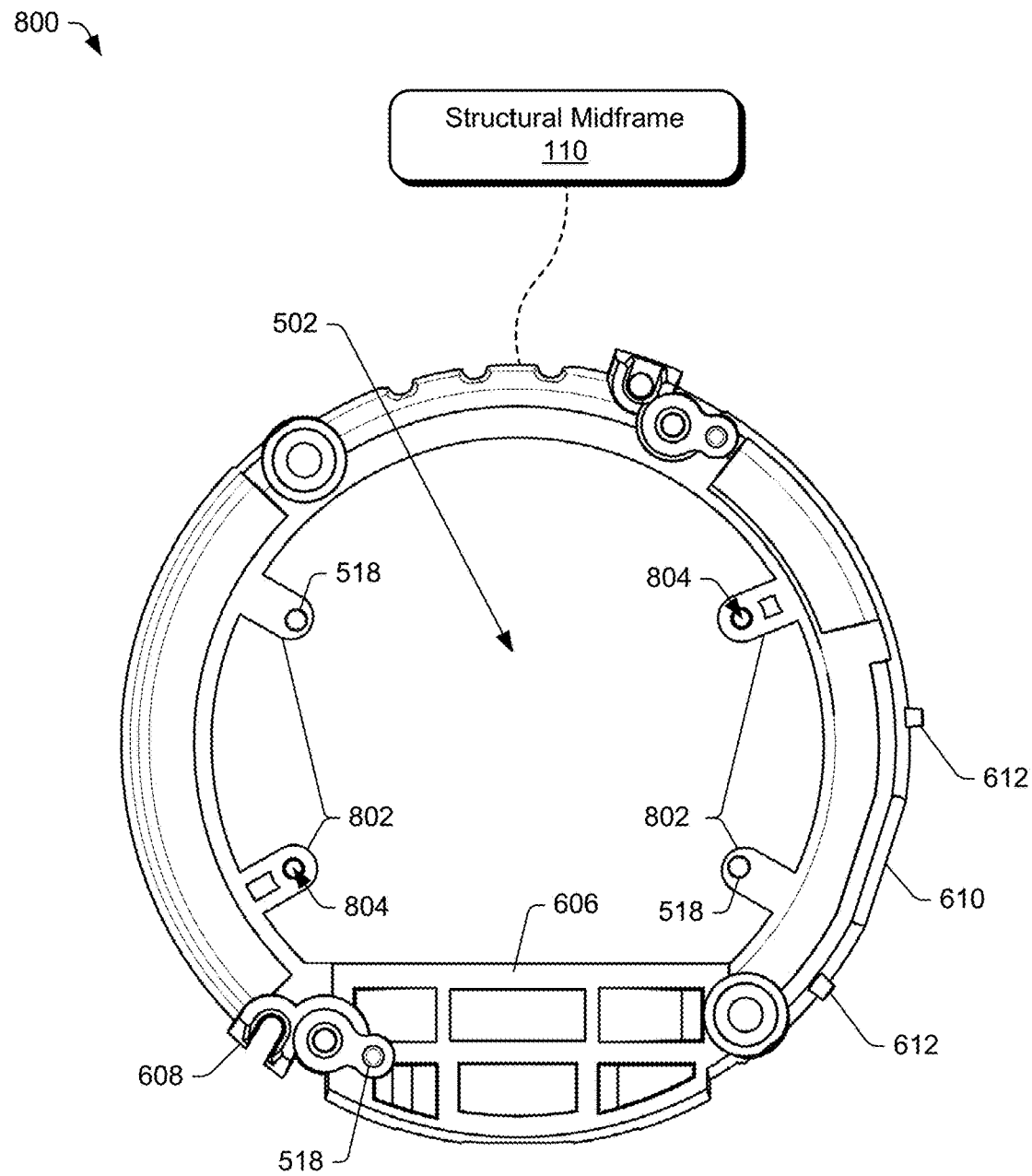
FIG. 8 illustrates a rear elevational view of the midframe from FIG. 7.
Figure 9:
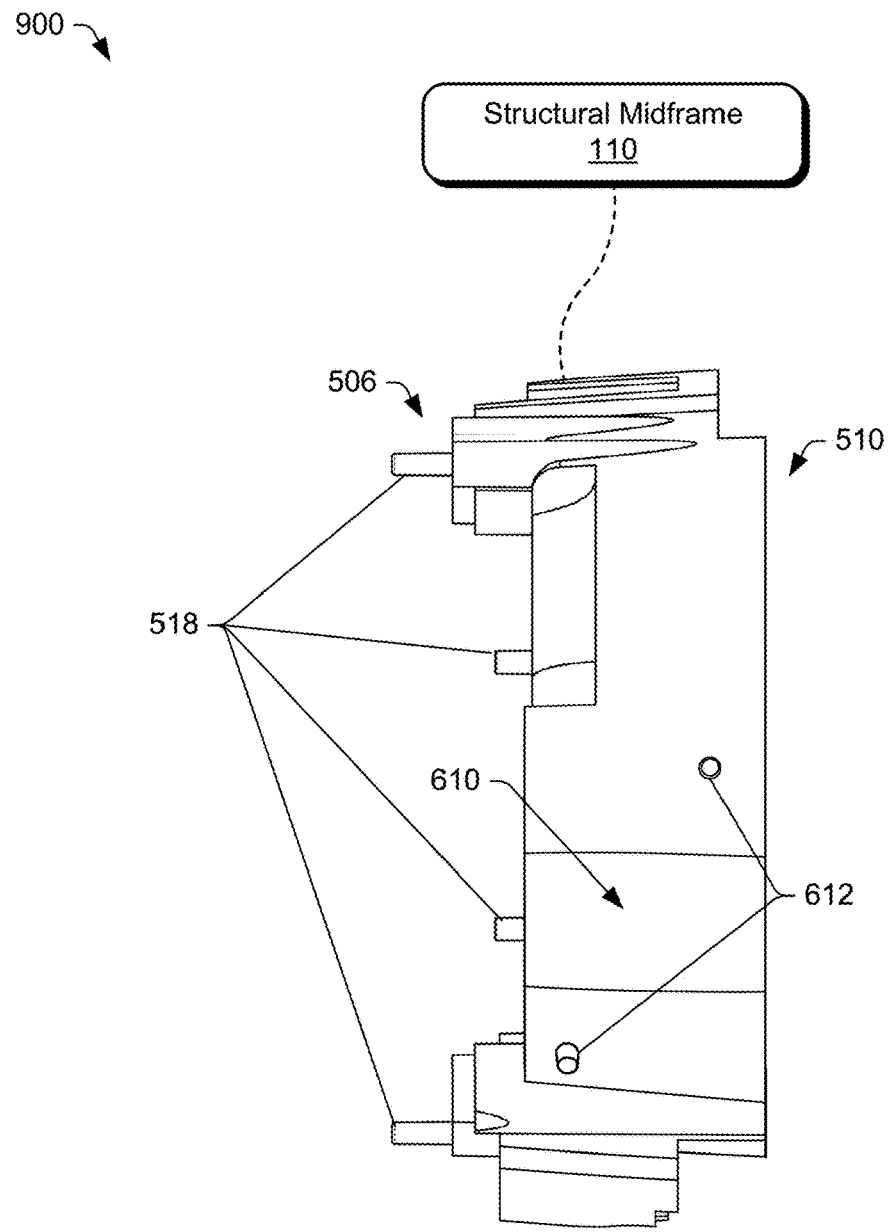
FIG. 9 illustrates a left elevational view of the example midframe from FIG. 7.

FIGS. 5-9 illustrate various views of the midframe 110 from FIG. 1, in accordance with one or more aspects. FIG. 5 illustrates a front-right isometric view 500 of the example midframe 110 from FIG. 1. FIG. 6 illustrates a front elevational view of the midframe from FIG. 5. FIG. 7 illustrates a rear-left isometric view of the example midframe from FIG. 1. FIG. 8 illustrates a rear elevational view of the midframe from FIG. 7. FIG. 9 illustrates a left elevational view of the example midframe from FIG. 7.

Referring to FIG. 5, the structural midframe 110 is generally ring-shaped, forming a generally cylindrical shape defining a cavity 502, and having a central axis (e.g., center axis 402), a first opening 504 (front opening) at a first end 506, and a second opening 508 (rear opening, also shown in FIG. 7) at a second end 510. The midframe 110 includes an inner surface 512 and an opposing outer surface 514. The inner surface 512 may substantially correspond to an inner diameter of the midframe 110. The outer surface 514 may substantially correspond to an outer diameter of the midframe 110. However, due to the various features implemented on the midframe 110, the inner and outer diameters may not be constant around the center axis 402. The midframe 110 includes a variety of features usable to assemble various features of the electronic device described with respect to FIGS. 1-4. For example, the midframe 110 may include a plurality of screw holes 516 for receiving screws or bolts. The screw holes 516 may be substantially parallel to the center axis 402. One or more screw holes 516 may be located between the inner surface 512 and the outer surface 514 of the midframe 110. In some aspects, one or more screw holes 516 may be located on an extending member (e.g., flange) that extends from the inner surface 512 of the midframe 110 toward the center axis 402.

The midframe 110 may also include a plurality of protrusions 518 (e.g., pins, pegs, rods) used to align components assembled to the midframe 110, including the PCBs (e.g., the main logic board 114, the camera board 116, the IR board 118), the heat spreader 136, and the heatsink 120. The protrusions 518 may longitudinally extend in a direction that is substantially parallel with the center axis 402. One or more protrusions 518 (e.g., protrusion 518-1) may extend outwardly from the first end 506 of the midframe 110 and one or more additional protrusions 518 (e.g., protrusion 518-2) may extend outwardly from the second end 510 of the midframe 110. At least some of the protrusions 518 may be located between the inner surface 512 and the outer surface 514 of the midframe 110. In some aspects, at least some of the protrusions 518 may be located on a flange that extends from the inner surface 512 of the midframe 110 toward the center axis 402.

In addition, the midframe 110 may include one or more snap features 520 that are configured to mate with corresponding snap features on another component, such as the front housing member 106 in FIG. 1. The snap features 520 may be positioned on the inner surface 512 of the midframe 110, such that the snap features 520 extend from the inner surface 512 toward the center axis 402 of the midframe 110. As illustrated in FIG. 6, the snap features 520 may be positioned on the inner surface 512 of the midframe on opposing sides of the cavity 502 defined by the midframe 110.

Returning to FIG. 5, the first end 506 of the midframe 110 may include one or more substantially planar surfaces, such as first surface 522-1 and second surface 522-2. The first and second surfaces 522-1 and 522-2 may be coplanar with one another. Alternatively, the first surface 522-1 may define a plane that is substantially parallel to a plane defined by the second surface 522-2. In some aspects, the plane defined by each of the first and second surfaces 522-1 and 522-2, respectively, may be substantially orthogonal to the center axis 402 of the midframe. Each of the first and second surfaces 522-1 and 522-2 are configured to interface with a bonding material, such as PSA, which may bond the respective surface to the front housing member 106. By using the fasteners 134, including the snap features 520 and the PSA, on the midframe 110, the front housing member 106 may be assembled onto the midframe 110 rather than onto the rear housing member 108.

Compared to conventional techniques that may assemble the front housing member 106 to the rear housing member 108, assembling the front housing member 106 to the midframe 110 allows additional space in the assembly for thermal interface materials (e.g., heat spreaders, TIMs) for the camera, without enlarging the rear housing member 108. Additional thermal-exchange surfaces are also included by mating the front housing member 106 to the midframe 110. For example, the front housing member 106 may include one or more ribs or flanges that extend into the cavity 502 defined by the midframe 110, where the ribs or flanges include snap features that mate with the snap features 520 on the midframe, creating thermal-exchange surfaces between the front housing member 106 and the midframe 110.

The midframe 110 may also include a hinge-bearing surface 524. The hinge-bearing surface 524 may include a concave surface forming an inverse of a portion of sphere that is truncated to form a substantial C-shape. In this way, the hinge-bearing surface 524 may interface with a ball stem (e.g., the stem 128 illustrated in FIG. 1) of a generally spherical ball joint. In implementations, the hinge-bearing surface 524 provides a low-friction surface that abuts the sphere of the ball stem to (i) enable the electronic device 100 to tilt relative to the stand assembly 126 based on a force applied by a user and (ii) support the electronic device 100 in a tilted orientation relative to the stand assembly 126. In some aspects, the hinge-bearing surface 524 provides such friction and support without lubricant. The hinge-bearing surface 524 may include any suitable material, including polycarbonate, nylon, or other low-friction material. The hinge-bearing surface 524 forms an edge 526 with the outer surface of the midframe 110, where the edge 526 forms a partial circle that is open to receive a shaft portion 406 of the stem 128 of the ball joint. In this way, the stem 128 can be inserted through the open portion of the edge 526 of the hinge-bearing surface 524 and "snap" into place, enabling the hinge-bearing surface 524 to abut the sphere of the stem 128.

In addition, the midframe 110 may include one or more ribs 528 (e.g., rib 528-1, rib 528-2) located proximate to the hinge-bearing surface 524. The ribs 528 are configured to interface with mating ribs on the boot 132 shown in FIG. 1. The ribs 528 longitudinally extend transversely between the outer surface 514 and the inner surface 512. In the example illustrated in FIG. 6, the ribs 528 extend in a direction that is generally orthogonal to the center axis 402 and generally parallel to a central axis (e.g., axis 602) of the hinge-bearing surface 524. Alternatively, the ribs 528 may extend in a direction that is non-orthogonal to the center axis 402. Each of the ribs 528 may include a longitudinal axis 530 (e.g., the rib 528-1 includes longitudinal axis 604-1, the rib 528-2 includes longitudinal axis 604-2). The longitudinal axis 604-1 of the rib 528-1 may not intersect the center axis 402 of the midframe 110. Similarly, the longitudinal axis 604-2 of the rib 528-2 may not intersect the center axis 402 of the midframe. In some aspects, the ribs 528 are substantially parallel to one another and are positioned proximate to the first end 506 of the midframe 110 on opposing sides of the hinge-bearing surface 524 (e.g., the hinge-bearing surface 524 is positioned between the ribs 528).

The ribs 528 support control of a friction feeling of the hinge because the ribs 528 help secure the position of the boot 132. From a user perspective, this implementation helps the hinge "feel" more stable. The ribs 528 reduce negative effects of strain applied to the boot 132 when rotating the hinge, as compared to using holes or pins to assemble the boot 132 to the midframe 110. The ribs 528 are arranged to resist movement of the boot 132 relative to the midframe 110, which may result from friction forces acting on the boot 132 during three-dimensional (3D) rotational movement of the midframe 110 relative to the stem 128 of the ball joint.

The midframe 110 may also include a crossbeam 606 that provides structural support and rigidity to the midframe 110, particularly proximate to the hinge-bearing surface 524. The crossbeam 606 longitudinally extends transversely from one region (e.g., a first region) of the inner surface 512 to another region (e.g., a second region) of the inner surface 512, across a portion of the cavity 502 defined by the midframe 110. The crossbeam 606 may be positioned substantially orthogonal to the center axis 402 of the midframe 110. In some aspects, the crossbeam 606 is located proximate to the second end 510 of the midframe 110 (as illustrated in FIG. 7) and proximate to the hinge-bearing surface 524 (as illustrated in FIG. 6), which provides structural support and rigidity to the midframe 110 to resist flex (e.g., twisting movement) of the midframe 110. In one example, the crossbeam 606 reduces stress applied to PSA assembled to the midframe 110 on the first and second surfaces 522-1 and 522-2 when the 110 and the components assembled onto the midframe 110 are inserted into the rear housing member 108.

To assist with alignment of the midframe 110 with the rear housing member 108, the midframe 110 may include alignment guides, such as alignment guide 608. The alignment guide 608 may include any suitable guide, including a slot, channel, track, rib, protrusion, or sleeve, which can interface or mate with an opposing slot, channel, track, rib, protrusion, or sleeve on the rear housing member 108 to align the midframe 110 relative to the rear housing member 108 for assembly.

Continuing with the example illustrated in FIG. 6, the outer surface 514 of the midframe 110 includes a substantially planar region 610. The planar region 610 may be located on a circumference of the midframe 110, such that the planar region 610 faces an interior surface (not shown in FIG. 6) of the rear housing member 108. In some aspects, the planar region 610 may be located between two or more protrusions (e.g., alignment protrusions 612), which are usable as alignment features to align an antenna (not shown) with the midframe 110 for assembly. Accordingly, the planar region 610 may also be referred to as an antenna region. The antenna may include any suitable antenna, including a wireless-network antenna mounted on a flexible printed circuit board, which may be electrically connected to the camera board 116. The planar region 610 may reduce strain on certain features of the antenna, such as solder joints (e.g., solder joints connecting a coaxial cable to the antenna). The antenna may be a Wi-Fi antenna configured to enable access to a wireless network, e.g., using 2.4 GHz and/or 5 GHz bands, 802.11 standards.

By assembling the antenna onto the midframe 110, testing can be performed during the assembly process prior to inserting the assembly into the cavity of the rear housing member 108. Conventional devices that assemble the antenna to the housing have a likelihood of damaging the antenna when inserting other components into the housing. However, by assembling the antenna onto the midframe 110, as described herein, the likelihood of damaging the antenna when inserting the assembled components into the rear housing member 108 is reduced. The antenna may also be sensitive in terms of its proximity to other metals. By using alignment features (e.g., the substantially planar region 610, the alignment protrusions 612) on the midframe 110, the proximity of the antenna to other metals can be finely and accurately controlled in comparison to conventional devices that have internal components loosely assembled.

FIG. 7 illustrates a rear-left isometric view 700 of the example midframe from FIG. 1. This view 700 illustrates a view of the second end 510 of the midframe 110, including the second opening 508 and the crossbeam 606. Also illustrated are the substantially planar region 610 (e.g., antenna region) and the alignment protrusions 612, usable for mounting a flexible printed circuit board having the antenna.

FIG. 8 illustrates a rear elevational view 800 of the midframe from FIG. 7. The view 800 illustrates a view of the second end 510 of the midframe 110. The midframe 110 includes multiple extending members 802 that extend from the inner surface 512 of the midframe 110 and into the cavity 502 defined by the midframe 110. In some aspects, the extending members 802 extend toward the center axis 402 of the midframe. The extending members 802 may include one or more protrusions (e.g., protrusions 518) or holes 804 for aligning components, such as the PCBs, with the midframe 110.

As illustrated in FIG. 8, the planar region 610 and the alignment protrusions 612 provide an antenna region that, in the illustrated orientation of the midframe 110, is on a lower portion of the midframe 110. The lower region (e.g., bottom half) also includes the crossbeam 606 (shown in FIG. 8) and the hinge-bearing surface 524 for the ball joint. It is noted that the antenna region may be implemented at any suitable location along the perimeter (on the outer surface 514) of the midframe 110 and is not limited to the location illustrated in the figures.

FIG. 9 illustrates a left elevational view 900 of the example midframe 110 from FIG. 7. The view 900 illustrates a side view of the midframe 110, with the first end 506 on the left and the second end 510 on the right. As illustrated, the substantially planar region 610 and alignment protrusions 612 are located on the outer surface 514 of the midframe 110.

Example Methods

Figure 10:
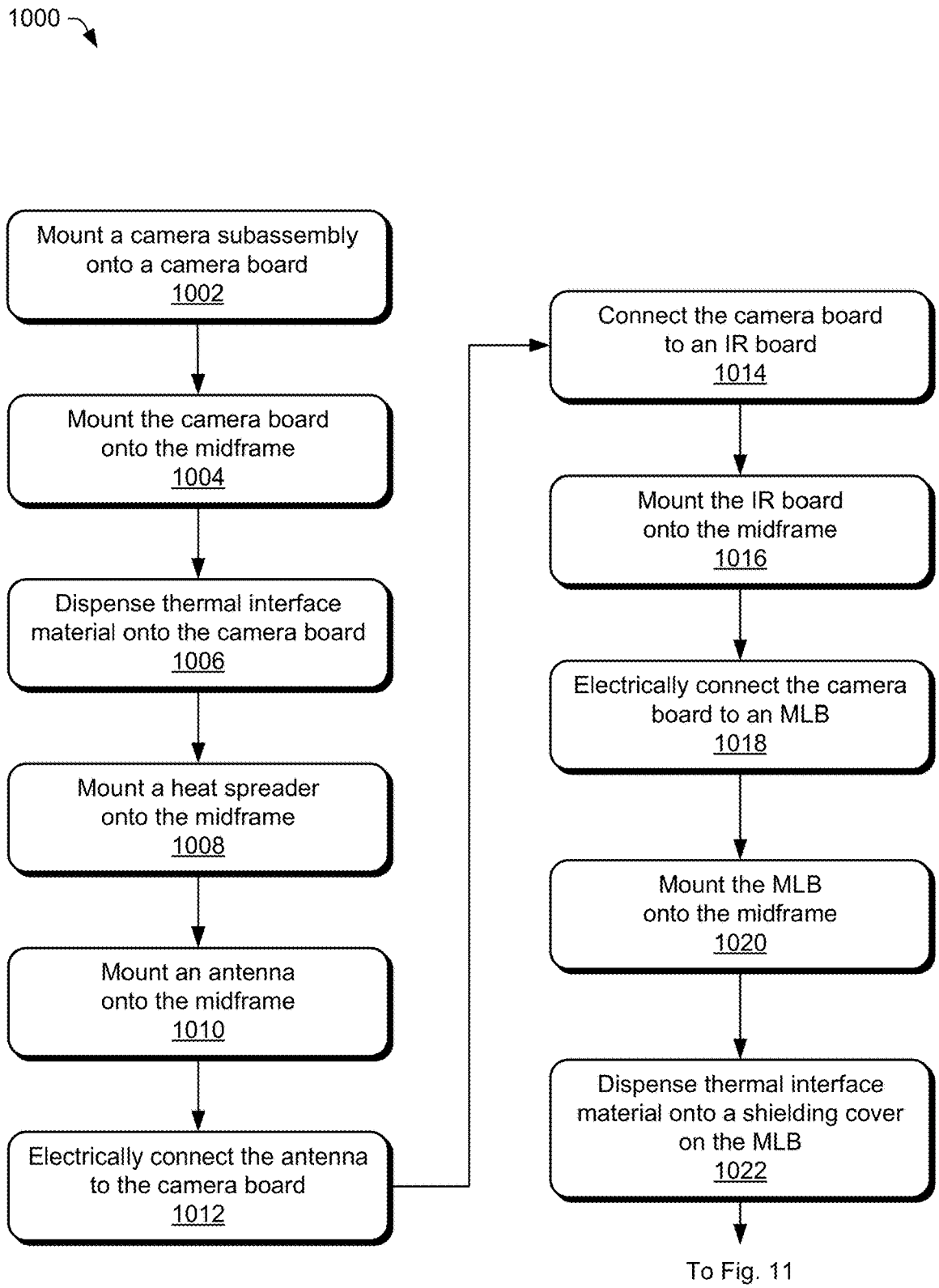
FIG. 10 depicts a method for assembly of a midframe subassembly.
Figure 11:
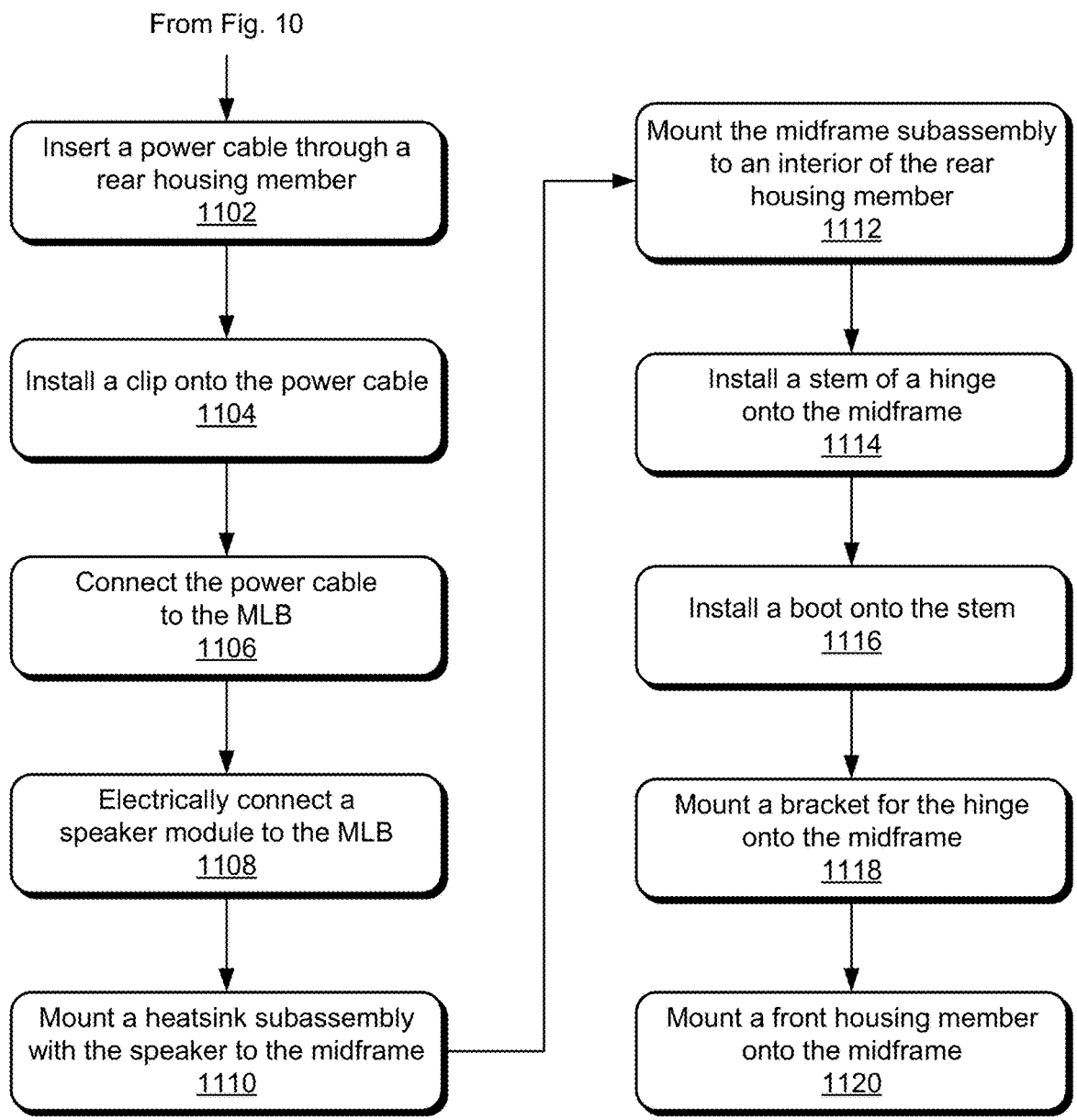
FIG. 11 depicts a method for a main assembly, which is continued from FIG. 10.

FIGS. 10 and 11 depict methods 1000 and 1100, which are shown as a set of blocks that specify operations performed but are not necessarily limited to the order or combinations shown for performing the operations by the respective blocks. Further, any of one or more of the operations may be repeated, combined, reorganized, or linked to provide a wide array of additional and/or alternate methods. In portions of the following discussion, reference may be made to the example electronic device 100 of FIG. 1 or to components of the electronic device as detailed in FIGS. 2-9, reference to which is made for example only. The techniques are not limited to performance by one entity or multiple entities operating on one device.

FIG. 10 depicts a method 1000 for assembly of a midframe subassembly. FIG. 11 depicts a method 1100 for a main assembly, which is continued from the method 1000 of FIG. 10.

At 1002, a camera subassembly is mounted onto a camera board. For example, the camera subassembly 112 may be mounted to a first side of the camera board 116. At 1004, the camera board 116 is mounted to the midframe 110 such that the first side of the camera board 116 faces an interior of the midframe 110.

At 1006, a thermal interface material is dispensed onto the camera board of the camera subassembly. The thermal interface material may include thermal gel, thermal paste, thermal adhesive, thermal tape, and so forth.

At 1008, a heat spreader is mounted onto the midframe. For example, the heat spreader 136 may be mounted onto the midframe 110 using one or more fasteners 134, such as screws. The heat spreader 136 may be mounted to the midframe 110 to cause the camera board 116 to be positioned between the heat spreader 136 and the midframe 110.

At 1010, an antenna is mounted onto the midframe. For example, the antenna may be a wireless-network antenna mounted on a flexible printed circuit board. The flexible printed circuit board may be mounted onto an antenna region, such as the planar region 610 of the midframe, and aligned with the midframe 110 using the alignment protrusions 612.

At 1012, the antenna is electrically connected to the camera board. For example, the antenna may be connected to the camera board 116 via a flexible cable.

At 1014, the camera board is connected to an IR board. For instance, the camera board 116 may be electrically connected to the IR board 118 via the FFC 144.

At 1016, the IR board is mounted to the midframe. For example, the IR board 118 may be mounted to the midframe 110 using, for example, one or more fasteners 134 (e.g., screws). The IR board 118 is mounted proximate to a front opening of the midframe 110 to cause the camera board 116 to be positioned between the IR board 118 and the heat spreader 136.

At 1018, the camera board is electrically connected to an MLB. For example, the camera board 116 may be electrically connected to the MLB 114 via the FPC 142 and separated from the MLB 116 by the heat spreader 136.

At 1020, the MLB is mounted to the midframe. For example, the MLB 114 may be mounted to the midframe 110 proximate to a rear opening of the midframe 110 such that the heat spreader 136 is positioned between the MLB 114 and the camera board 116.

At 1022, thermal interface material is dispensed onto a shielding cover on the MLB. For example, a thermal gel or other thermal interface material may be dispensed onto the shielding cover located on a first side of the MLB 114 that is opposite a second side of the MLB 114 that faces the heat spreader 136.

Continuing to FIG. 11, at 1102, the power cable is inserted through the rear housing member. For example, the cable 124 may be inserted and overextended through the hole 202 in the rear housing member 108 from the exterior of the rear housing member 108 toward the interior of the rear housing member 108.

At 1104, a clip is installed onto the power cable. For example, the clip 146 may be assembled to the cable 124 to resist longitudinal movement of the cable 124 through the hole 202 in the rear housing member 108 from within the cavity toward the outside of the rear housing member 108.

At 1106, the power cable is connected to the MLB. At 1108, a speaker module is electrically connected to the MLB. For example, the speaker module 122 may be electrically connected to the main logic board 114 via one or more wires passing through or around the heatsink 120.

At 1110, a heatsink subassembly with the speaker module is mounted to the midframe. For example, the heatsink 120 may be mounted to the midframe 110 on an opposing side of the MLB 114 from the midframe 110 using one or more fasteners 134 (e.g., screws).

At 1112, the midframe subassembly is mounted to an interior of the rear housing member. For example, the midframe subassembly, which includes at least the midframe 110 the components mounted to the midframe 110 (e.g., the camera board 116, the IR board 118, the heat spreader 136, the MLB 114, and the heatsink 120, which includes the speaker module 122) may be inserted into the cavity defined by the rear housing member 108 and secured within the rear housing member 108 using one or more fasteners 134 (e.g., screws).

At 1114, a stem of a hinge is installed onto the midframe. For example, the stem 128 of the hinge may include a shaft portion 406 and a head portion 408, where the shaft portion 406 is inserted into the hole 148 of the rear housing member 108 and the head portion 408 is seated onto the hinge-bearing surface 524 of the midframe 110.

At 1116, a boot is installed onto the stem. For example, the boot 132 may be positioned to interface with the sphere of the stem 128 and the midframe 110, which includes the ribs 528 on opposing sides of the hinge-bearing surface 524 to secure the position of the boot 132.

At 1118, a bracket for the hinge is mounted onto the midframe. For example, the bracket 130 is mounted to the midframe 110 to secure the boot 132 and the stem 128 in place, while allowing rotational movement of the sphere of the stem 128.

At 1120, a front housing member is mounted onto the midframe. For example, the front housing member 106 may be mounted to the midframe 110 via the snap features 520 and one or more fasteners 134, such as PSA.

What is claimed is:

1. An electronic device comprising:
    a housing member;
    a midframe forming a structural frame for the electronic device, the midframe positioned within the housing member, the midframe having an outer surface at least a portion of which faces an interior surface of the housing member; and
    a plurality of components assembled onto the midframe, the plurality of components comprising:
        a wireless-network antenna assembled onto the outer surface of the midframe, the wireless-network antenna being mounted on a flexible printed circuit board, the outer surface of the midframe including a substantially planar region configured to interface with at least a portion of the wireless-network antenna;
        a camera subassembly assembled onto the midframe;
        one or more printed circuit boards assembled onto the midframe; and
        a speaker module assembled onto the midframe.

2. The electronic device as recited in claim 1, wherein:
    the midframe includes at least two protrusions extending from the outer surface; and
    the substantially planar region is located between the at least two protrusions.

3. The electronic device as recited in claim 1, wherein the midframe includes a plurality of protrusions usable to align the one or more printed circuit boards with the midframe.

4. The electronic device as recited in claim 1, wherein the midframe includes multiple snap features configured to mate with corresponding snap features on a front housing member to assemble the front housing member onto the midframe.

5. The electronic device as recited in claim 1, wherein the housing forms a shell with a cap, wherein the shell includes a generally cylindrical shell and the cap forms a generally spherical cap.

6. The electronic device as recited in claim 1, wherein:
    the plurality of components includes a heatsink assembled onto the midframe; and
    the speaker module is indirectly assembled onto the midframe by being assembled onto the heatsink.

7. The electronic device as recited in claim 1, wherein:
    the midframe includes a hinge-bearing surface configured for a ball joint; and
    the hinge-bearing surface comprises a concave surface that is an inverse of a portion of a sphere and is truncated to form a substantial C-shape.

8. The electronic device as recited in claim 7, wherein:
    the midframe includes first and second ribs positioned at opposing ends of the hinge-bearing surface; and
    the first and second ribs extend transversely relative to the aperture defined by the midframe.

9. The electronic device as recited in claim 8, wherein the midframe includes a crossbeam located proximate to the hinge-bearing surface, the crossbeam positioned transversely relative to the aperture defined by the midframe.

10. The electronic device as recited in claim 9, wherein the crossbeam longitudinally extends in a direction that is substantially orthogonal to the first and second ribs.

11. A structural midframe for an electronic device, the structural midframe comprising:
    a shape defining an aperture and configured to be slidably inserted into a housing member;
    an inner surface associated with an inner diameter and an outer surface associated with an outer diameter;
    an antenna region located on the outer surface, the antenna region including a substantially planar region and at least two alignment protrusions for aligning a flexible printed circuit board having an antenna that is configured to be assembled onto the structural midframe;
    a plurality of features for mounting a plurality of printed circuit boards, one or more heat spreaders, and one or more heatsinks onto the structural midframe;
    a hinge-bearing surface having a concave surface forming an inverse of a portion of a sphere, the hinge-bearing surface configured to interface with a sphere of a ball joint.

12. The structural midframe as recited in claim 11, wherein the substantially planar region of the antenna region reduces strain on solder joints on the flexible printed circuit board having the antenna.

13. The structural midframe as recited in claim 11, wherein the at least two alignment protrusions are positioned on opposing sides of the substantially planar region.

14. The structural midframe as recited in claim 11, further comprising a plurality of protrusions extending generally in a direction parallel to a center axis of the structural midframe and usable to align the plurality of printed circuit boards with the structural midframe.

15. The structural midframe as recited in claim 11, further comprising one or more substantially planar regions forming a plane that is substantially orthogonal to a center axis of the structural midframe, the one or more substantially planar regions configured to interface with a bonding material that bonds the front housing member to the structural midframe.

16. The structural midframe as recited in claim 11, wherein the hinge-bearing surface is truncated to form a substantial C-shape to receive a stem of the ball joint.

17. The structural midframe as recited in claim 11, wherein the first and second ribs are arranged to resist rotational movement of the boot relative to the structural midframe.

18. The structural midframe as recited in claim 11, wherein the crossbeam longitudinally extends in a direction that is substantially orthogonal to at least one of the first and second ribs.

19. A method for assembly of a midframe subassembly of an electronic device, the method comprising:
    mounting the camera board of a camera subassembly onto a midframe that forms a structural frame for the electronic device;
    mounting a heat spreader onto the midframe to cause the camera board to be positioned between the heat spreader and the midframe;
    electrically connecting the camera board to an infrared board;

mounting the infrared board onto the midframe to cause the camera board to be positioned between the infrared board and the heat spreader;

electrically connecting the camera board to a main logic board; and mounting the main logic board onto the midframe to provide the midframe subassembly.

20. The method as recited in claim 19, further comprising assembling a main assembly by at least:

inserting a power cable through a hole in a rear housing member of a housing of the electronic device;

installing a clip onto the power cable to prevent the power cable from exiting the rear housing member beyond a location at which the clip engages the power cable; and electrically connecting the power cable to the main logic board.

21. The method as recited in claim 20, wherein assembling the main assembly further comprises:

electrically connecting a speaker module to the main logic board, the speaker module included in a heatsink subassembly; and mounting the heatsink subassembly to the midframe to form a midframe subassembly.

22. The method as recited in claim 21, wherein assembling the main assembly further comprises:

inserting the midframe subassembly into a cavity defined by the rear housing member; and mounting the midframe subassembly to an interior of the rear housing member.

23. The method as recited in claim 22, wherein assembling the main assembly further comprises:

installing a stem of a hinge onto the midframe by inserting a shaft portion of the stem into an additional hole in the rear housing member and seating a head portion of the stem on a hinge-bearing surface of the midframe;

installing a boot onto the stem of the hinge, the boot interfacing with the head portion of the stem and the midframe; and mounting a bracket for the hinge onto the midframe to secure the stem and the boot.

24. The method as recited in claim 19, wherein assembling the main assembly further comprises mounting a front housing member onto the midframe using one or more fasteners to provide a main assembly of the electronic device.

* * * * *